United States Patent [19]

Chellis et al.

[11] 4,201,616
[45] May 6, 1980

[54] DIMENSIONALLY STABLE LAMINATED PRINTED CIRCUIT CORES OR BOARDS AND METHOD OF FABRICATING SAME

[75] Inventors: Leroy N. Chellis, Endwell; Theron L. Ellis, Vestal, both of N.Y.

[73] Assignee: International Business Machines Corporation, Armonk, N.Y.

[21] Appl. No.: 918,222

[22] Filed: Jun. 23, 1978

[51] Int. Cl.² ............................................. C09J 5/00
[52] U.S. Cl. .................................. 156/307.1; 29/830; 156/330; 156/182; 156/307.7; 174/68.5; 428/212; 428/416; 428/415; 428/901
[58] Field of Search ............... 156/312, 313, 330, 306, 156/902, 901; 428/212, 416, 415, 901; 174/68.5; 29/625, 628

[56] References Cited

U.S. PATENT DOCUMENTS

| | | | |
|---|---|---|---|
| 2,899,608 | 8/1959 | Wellard | 317/101 |
| 2,990,310 | 6/1961 | Chan | 174/68.5 |
| 3,201,851 | 8/1965 | Stearns | 29/625 |
| 3,228,091 | 1/1966 | Rice et al. | 174/68.5 |
| 3,244,795 | 4/1966 | Latimer | 174/68.5 |
| 3,344,515 | 10/1967 | Schuster et al. | 174/68.5 |
| 3,523,037 | 8/1970 | Chellis | 428/273 |
| 3,554,877 | 1/1971 | Geisler | 204/15 |
| 3,654,097 | 4/1972 | Degnan | 174/68.5 |
| 3,791,858 | 2/1974 | McPherson et al. | 427/98 |
| 3,867,759 | 2/1975 | Siefker | 29/628 |
| 3,969,177 | 7/1976 | Doran et al. | 156/288 |
| 4,030,190 | 6/1977 | Varker | 29/625 |

Primary Examiner—William A. Powell
Assistant Examiner—J. J. Gallagher
Attorney, Agent, or Firm—Saul A. Seinberg

[57] ABSTRACT

A multi-layered printed circuit board is disclosed having a plurality of circuitized laminations therein. The laminates are fabricated or secured by curing layers of glass cloth which have been impregnated with heat curable resins at temperatures in excess of their glass transition temperature, the point at which such material begins to distort.

Those laminations which will see at least one further curing cycle, after having themselves been cured, are formed from glass cloth impregnated heat curable resin combinations having a glass transition temperature which is significantly higher than that of the heat curable materials employed to form the subsequently and singly cured laminations. In this manner, lamination shift or distortion is appreciably reduced since those laminations which undergo a plurality of "curing" cycles, only experience one excursion beyond their transition temperature. Thus, registration mismatch between any of the circuitized laminates will not exceed acceptable levels.

6 Claims, 5 Drawing Figures

DIMENSIONALLY STABLE LAMINATED PRINTED CIRCUIT CORES OR BOARDS AND METHOD OF FABRICATING SAME

BACKGROUND OF THE INVENTION

1. Field of the Invention

This invention relates to a method, and the product produced thereby, for use in fabricating a multi-layered printed circuit board. It pertains, more particularly, to a printed circuit board having laminates which are formed from or secured by epoxy-resin layers having glass transition temperatures significantly higher than that of the epoxy-resin layers utilized to form or secure other laminates therein.

2. Description of the Prior Art

Multi-layered printed circuit boards are well known in the prior art. The processing technology therefor has advanced to the point where such boards are capable of supporting very high density circuits and modules. Even this capability, however, has not proven sufficient as advances in modern electronics have fueled a need for yet increased densities.

Increased density capability has been provided, in part, by increasing the number and size of signal, ground and voltage planes found in a multi-layered printed circuit board, as well as conductor density in the signal planes. In many applications, in order to minimize the number of interboard connections and the obvious potential problems associated therewith, it has become desirable to utilize as large and as dense a multi-layered circuit board as possible.

These design constraints and improved packaging techniques have placed greater, even acute, emphasis on dimensional stability. Clearly, as the size and circuit densities of a board are increased, it becomes increasingly difficult to maintain registration between the various interplanes since they have differing expansion characteristics which becomes important during the processing steps by which a particular board is fabricated.

In the process of forming a printed circuit board, it has been a standard industry practice to begin with a layer of an insulative base material, to circuitize one or both surfaces of the base material and to combine a number of these circuitized layers. Typical of the prior art processes are the methods shown and described in U.S. Pat. Nos. 3,523,037; 3,554,877; 3,791,858 and 3,867,759.

In U.S. Pat. No. 3,523,037, a typical epoxy composition is described as is its use in impregnating a glass fabric to form, after curing, the base material referred to above. In U.S. Pat. No. 3,554,877, individual, double-sided printed circuit boards are laminated together to form a multi-layered printed circuit board. Similarly, in U.S. Pat No. 3,867,759, a plurality of strip transmission line printed circuit board segments are used to form a plurality of printed circuit boards, each one of which becomes a layer in and part of a larger, integrated package. In U.S. Pat. No. 3,791,858, a laminated printed circuit board is produced using additive techniques for forming conductors within each layer with an initial layer being built up on an insulative base material, such as the glass cloth-epoxy resin combination referred to above.

In addition to the foregoing, U.S. Pat. Nos. 3,969,177 and 4,030,190 also disclose methods for forming improved multilayer printed circuit boards. U.S. Pat. No. 3,969,177 discloses a laminating method wherein a stack of cured and uncured, epoxy impregnated glass cloth layers are further cured at the same time without planishing plates. In U.S. Pat. No. 4,030,190, a method of forming dimensionally stable board assemblies is taught wherein each dielectric layer thereof is cured after being added to a base core.

Typically, such printed circuit boards are fabricated by forming a first layer from such an epoxy-glass material combination and curing it above its glass transition temperature whereat crosslinking takes place. Additional layers are added, after the base layer is circuitized. However, in forming such boards, a particular layer, once captured, may be subjected to several cycles above its glass transition temperature. Whenever this occurs, the linkage chains are thermally agitated and linkage is reduced. As a result, the affected layer or layers become rubbery, rather than glossy. The resultant deformation translates into a random dimensional change which seriously affects interlayer or interplane registration. The randomness of this dimensional instability makes predetermined compensation therefor rather difficult.

OBJECTS AND SUMMARY OF THE INVENTION

Accordingly, it is a principal object of the present invention to amend the prior art process of fabricating multi-layered printed circuit boards so that dimensional instability is reduced or eliminated as a result of the fabrication process itself.

A more specific object of the present invention is to provide an improved fabrication method for forming multi-layered printed circuit boards which have significantly enhanced interplanar registration.

Another object of the present invention is to provide an improved method of forming such multi-layered printed circuit boards which is both economical to implement and reliable in use.

Yet another object in the present invention is to provide such an improved method of forming multi-layered printed circuit boards which does not seriously interfere with nor unduly complicate the basic fabrication process.

The foregoing and other objects are accomplished in accordance with one aspect of the present invention by forming the layers of a multi-layered printed circuit board, which would ordinarily experience at least one further curing cycle after having themselves been cured, of a heat curable material having a glass transition temperature significantly higher than that of the heat curable material employed to form the laminations which are subjected to only one cycle above their transition point. Lamination distortion is therefore reduced since those layers which undergo a plurality of "curing" cycles only experience one or a reduced number of excursions beyond their transition temperature. Reduced laminate distortion, of course, translates directly into improved interplanar registration in the finished printed circuit board.

DESCRIPTION OF THE PREFERRED EMBODIMENT

Figure 1:
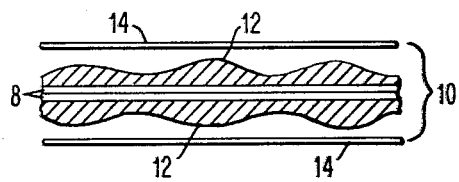
FIG. 1 schematically illustrates the formation of a power core laminate which is to be used in a multi-layered printed circuit board which has been fabricated in accordance with the present invention.

Referring now to the drawings wherein like reference numerals have been used in the several views to identify like elements, FIG. 1 schematically illustrates the formation of a "power core" from "pre-preg" or "B stage" layers. The term "pre-preg" is used herein to designate the insulative or dielectric layer which supports and separates the conductive foil layers which are subsequently circuitized to form the desired conductive paths therein. A pre-preg layer 8 is formed by passing a glass cloth ribbon through an epoxy resin solution whereby the cloth is impregnated. Thereafter, the solvents are driven off and the resin impregnated, heat curable, glass cloth is partially cured; that is, the epoxy resin residue is polymerized to a desired state of partial cure. The partially cured ribbon is then cut into sheets of desired size in preparation for further processing. Additional and more specific details relative to the pre-preg formation process and the composition of a typical epoxy resin may be had by referring to the above noted U.S. Pat. No. 3,523,037. As cut, the pre-preg sheets can be easily handled without danger of adherence to one another or to other objects.

A power core 10, as shown in FIG. 1, is formed by using any number of pre-preg sheets 8, the number used being a function of the desired dielectric thickness of the power core. A sheet of copper foil 12, or of any other suitable metal, is then added to the exposed surfaces of the pre-preg sheets 8. It should be noted that the thickness of the foil sheets 12 is a function of the desired thickness of the circuits to be formed therein. Planishing plates 14 are then utilized to press the pre-preg and foil assembly together while heat is applied thereto to effect final and full curing of the pre-preg sheets and adherence of the copper foil layers 12. When curing is finished, the planishing plates 14 are removed and the resulting product called the "raw core" is then circuitized or processed to form predetermined circuit paths in the copper foil 12. It should be noted that the curing process which takes place while the pre-preg and foil assembly is held by the planishing plates, takes place at a sufficient temperature and for a sufficient period of time to enable full and complete curing. The personalization of each pre-preg and copper foil assembly is accomplished by known techniques such as is described in the copending and commonly assigned U.S. Patent Application Ser. Nos. 651,092 and 901,044. Application Ser. No. 651,092 was abandoned in favor of continuation application Ser. No. 848,955, filed 11/07/77, also now abandoned.

Figure 2:
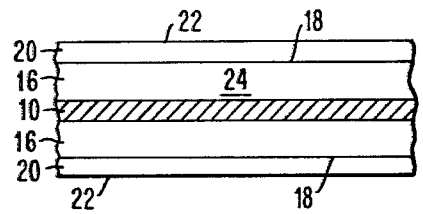
FIG. 2 schematically depicts a subassembly fabricated from the power core laminate shown in FIG. 1.

The power core 10, after being circuitized, is then provided with additional layers of pre-preg 16, as is shown in FIG. 2. A suitable sheet of copper foil 18 is then added to each of the newly provided pre-preg layers 16 and this assembly is now placed between the planishing plates 14 and heated to a temperature sufficient to fully cure the pre-preg layers 16. It should be noted that the original pre-preg layers 8 now undergo a second complete cure cycle above the glass transition temperature of the epoxy glass combination which forms this layer. This second curing cycle causes the prior polymerization or crosslinking to be reduced or reversed and the pre-preg sheets change from a "glassy" state to a "rubbery" state. In the latter state, the pre-preg sheets 8 distort randomly in an unpredictable fashion and thereby move the foil which has been adhered thereto in an incalculable manner.

After the pre-preg sheets 16 have been cured and the newly added copper foil layer 18 adhered thereto, the planishing plates 14 are removed and the copper foil layer 18 is circuitized. In a similar manner, another pre-preg sheet 20 is added to each side of the pre-preg and foil assembly and topped with another sheet of copper foil 22. The newly added pre-preg sheets 20 and copper foil 22 are then cured and adhered as previously described to form the subassembly 24 which is shown in FIG. 2. It should again be noted that each layer of pre-preg which is added to the central power core 10 causes previously added layers to experience additional curing cycles. Thus, the pre-preg layers 8 in the power core 10 experience two excursions beyond their glass transition temperature after they have been fully cured and the pre-preg layers 16 experience one such additional excursion when the subsequently added pre-preg layers 20 are themselves cured. The interlayer and intralayer stresses and distortion which takes place with each curing cycle leads to a significant registration problem, which shall be more fully explained hereinafter. The subassembly 24 shown and explained herein is, of course, merely a typical example which can conveniently have any desired number of layers. It is only important to note, with respect to the prior art fabrication methods, the effects on the central and earlier added layers of the curing process for the outer or subsequently added layers.

Figure 3:
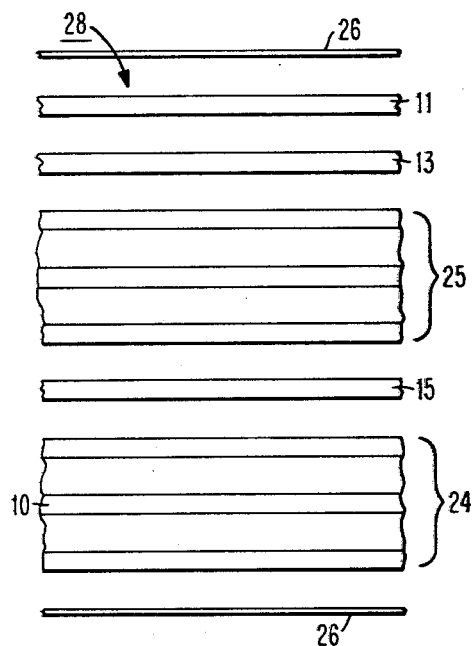
FIG. 3 shows a representative cross-sectional view of a typical multi-layered printed circuit board fabricated in accordance with prior art teachings.

Once completed, the subassembly 24 is placed in a stack along with other subassemblies and/or power cores as a particular printed circuit design may dictate. A cross-sectional view of a typical printed circuit board 28 fabricated in the above-described prior art manner is shown in FIG. 3. Subassembly 24 and a second subassembly 25 are stacked together with several other power cores 10, 13 and 15. The subassemblies 24 and 25 may be greater than two in number and may be identical, as shown for convenience, or different in accordance with the dictates of a particular design. The stack shown in FIG. 3 is provided with a sheet of copper foil 26 at its top and bottom and is itself further pressurized, under heat, between planishing plates 14 to form the finished printed circuit board 28.

Figure 4:
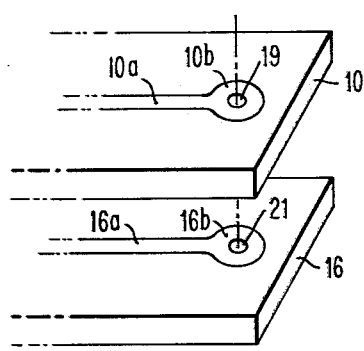
FIG. 4 schematically illustrates the nature of the resolution problem resulting from excessive thermal cycling of a prior art printed circuit board.

When further fabrication of the finished board 28 is attempted, manufacturing difficulties may arise because of misregistration which is present as a result of the excessive thermal cycling of the various epoxy glass layers as noted above. An example of the nature of the registration problem is schematically depicted in FIG. 4. There, power cores 10 and 16 are shown, each having a land and pad connected thereto, respectively identified by reference numerals 10a, 10b, 16a and 16b. The pad 10b has a hole 19 drilled in the center thereof through board power core 10 and the pad 16b has a similar hole 21 of equal diameter drilled through it and the power core 13. It is intended in the placement of such pads that the holes 19 and 21 be in axial alignment. However, power core 10 and power core 16 have each experienced several excursions each beyond their glass transition temperature. As a result, the hole 19 and 21 will have been shifted in a random manner so that they will no longer be in axial alignment. A study of the degree of distortion or shifting in the buried or hidden power cores such as 10 and 16, shows that these shifts in registration can be significant. The scale factors or measurement of growth or shrinkage in the epoxy glass layers have been found to have a standard deviation of one hundred by two hundred microinches per inch. Over the ten-inch dimension of the multilayer printed circuit boards currently in manufacture, such standard deviations result in misregistration in the order of one to two mils. When added to other expected deviations, the resultant total misregistration can be in excess of the allowable amount. When this happens, the board is obviously rejected.

The total margin for error in a board, as represented herein by the degree of shift allowed between the pads 10b and 16b of FIG. 4, includes and anticipates errors resulting from drill wander, the drill starting point, the preciseness of the circuitization of the various foils and other errors which creep in during the manufacturing process. Since most if not all of the other factors cannot be further accommodated with present day technology, the registration error arising from the excessive cycling of epoxy glass layers beyond their $T_G$ is the aspect of fabrication which must be corrected. In other words, the misregistration resulting from the excessive cycling of a power core beyond its glass transition temperature is the correctable factor which causes the board to be rejected.

Such correction or compensation is achieved in accordance with the present invention by fabricating certain of the pre-preg sheets from an epoxy glass combination which has a relatively high glass transition temperature. One material which can be used for this purpose is Polyimide, which can be purchased under the tradename KERAMID-601 (a trademark of Rhodia Incorporated). Polyimide has a glass transition temperature of 280° Centigrade. Another resin material which might be used for this purpose is TRIAZINE TA (manufactured by Mobay Chemical Company) which has a glass transition temperature greater than 250° Centigrade. Yet another resin material suitable for purposes of the present invention is XYLOK 235C (a trademark of the Ciba-Geigy Company) which also has a glass transition temperature in excess of 250° Centigrade.

Figure 5:
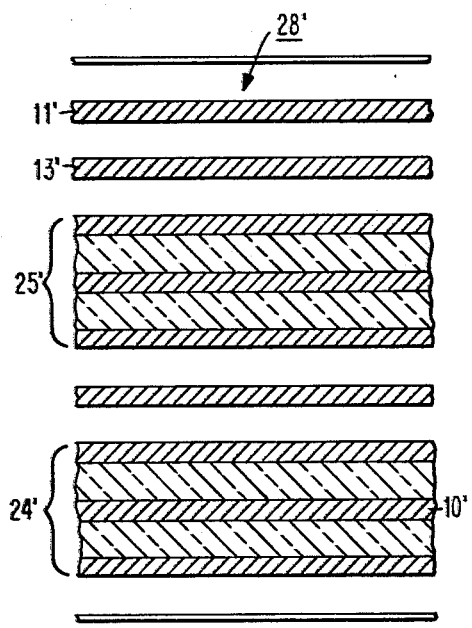
FIG. 5 schematically depicts a multi-layered printed circuit board, in cross-sectional view, which has been fabricated in accordance with the principles of the present invention.

If any of these materials are used, for example, in fabricating pre-preg sheets which are then used to form a power core 10', as shown in FIG. 5, such a core would be cured at a temperature in excess of 250° Centigrade. Note that it will make no difference in practicing the present invention whether the pre-preg sheets 10' are uncured or partially cured prior to being fully cured. In a similar manner, all of the other epoxy glass layers or power cores used in the board 28' and which experience temperature cycles above the 170° Centigrade curing temperature for the typical resin used in the prior art fabrication format, will not exceed their glass transition temperature. This is because the power core 10', once fully cured, is not raised above 170° Centigrade during the remainder of the fabrication process for the total printed circuit board. As shown in FIG. 5, the buried power cores or epoxy glass layers which would normally see multiple transitions beyond their $T_G$ would be formed from a resin impregnated material having a significantly higher glass transition temperature. It is expected that this method could also be applied and extended so that instead of two different resin materials as proposed above, three could be used thereby providing even tighter control of the registration problem as might be required by a particular design. Thus, a first power core could be fabricated from a resin impregnated glass cloth or other suitable heat curable material having a rather high $T_G$, a second layer of a suitable heat curable composite having a moderate $T_G$ could be sandwiched around the first layer and a final layer of a suitable heat curable composite having a $T_G$ which is relatively low could then be employed. Then, each layer could be fully and completely cured without affecting any previously cured layers and with minimal, if any, misregistration. Layers of appropriate metal foil could be interspersed between layers of or sandwiched about the power core as needed and bonded thereto as described above.

While the present invention has been described in the context of the preferred embodiment thereof, it will be readily apparent to those skilled in the art that other modifications and variations can be made therein without departing from the spirit or scope of the present invention. Accordingly, it is not intended that the present invention be limited to the specifics of the foregoing description of the preferred embodiment, but rather as being limited only by the scope of the invention as defined in the claims appended hereto.

Having thus described our invention, what we claim as new, and desire to secure by Letters Patent is:

1. A method of forming a multi-layered printed circuit board comprising the steps of:
   (a) forming a first section of the board of at least one layer of a first heat curable material having a first transition temperature;
   (b) fully curing said first section by subjecting it to a temperature in excess of said first transition temperature for a period sufficient to effect a complete curing thereof;
   (c) forming a second section of the board by placing one or more layers of a second heat curable material having a second transition temperature below that of said first transition temperature in contact with said first section, said second transition temperature being one which will not thermally affect the prior full cure of said first section; and
   (d) fully curing said second section by subjecting it to a temperature in excess of said second transition temperature, but below said first transition temperature, for a period sufficient to effect a complete curing thereof.

2. The method according to claim 1 which comprises the additional steps of:
   (a) forming additional sections of the board by placing one or more layers of additional heat curable material having transition temperatures below that of said first and second transition temperatures, said transition temperatures of said layers of said additional sections being low enough so that they will not thermally affect the full cure of any sections added prior thereto; and
   (b) fully curing said additional sections by subjecting them, as added, to temperatures in excess of the appropriate transition temperature therefor, but below said transition temperatures of any sections added prior thereto, for a period sufficient to effect a complete curing thereof.

3. The method according to claim 1 which comprises the additional step of adding a sheet of metal foil to each section of the board prior to its being fully cured and thereby adhering said sheet to either surface of said sections.

4. The method according to claim 3 which comprises the additional step of partially curing each layer of the sections of the board prior to formation of said sections.

5. The method according to claim 2 which comprises the additional step of adding a sheet of metal foil to each section of the board prior to its being fully cured and thereby adhering said sheet to either surface of said sections.

6. The method according to claim 5 which comprises the additional step of partially curing each layer of the sections of the board prior to formation of said sections.

* * * * *